US010418341B2

(12) United States Patent
Jung et al.

(10) Patent No.: US 10,418,341 B2
(45) Date of Patent: Sep. 17, 2019

(54) SEMICONDUCTOR DEVICE AND METHOD OF FORMING SIP WITH ELECTRICAL COMPONENT TERMINALS EXTENDING OUT FROM ENCAPSULANT

(71) Applicant: STATS ChipPAC Pte. Ltd., Singapore (SG)

(72) Inventors: JinHee Jung, Busan (KR); OhHan Kim, In-cheon (KR); InSang Yoon, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/686,584

(22) Filed: Aug. 25, 2017

(65) Prior Publication Data

US 2018/0061806 A1   Mar. 1, 2018

Related U.S. Application Data

(60) Provisional application No. 62/382,005, filed on Aug. 31, 2016.

(51) Int. Cl.
*H01L 23/00* (2006.01)
*H01L 21/56* (2006.01)
(Continued)

(52) U.S. Cl.
CPC .......... *H01L 24/96* (2013.01); *H01L 21/4853* (2013.01); *H01L 21/561* (2013.01); *H01L 21/565* (2013.01); *H01L 23/3114* (2013.01); *H01L 23/49838* (2013.01); *H01L 23/49861* (2013.01); *H01L 23/552* (2013.01); *H01L 24/16* (2013.01); *H01L 21/568* (2013.01); *H01L 2224/04105* (2013.01); *H01L 2224/12105* (2013.01); *H01L 2224/16227* (2013.01); *H01L 2224/95001* (2013.01);
(Continued)

(58) Field of Classification Search
CPC ................................ H01L 24/96; H01L 24/16
USPC ...................................................... 257/659
See application file for complete search history.

(56) References Cited

U.S. PATENT DOCUMENTS 6,001,671 A    12/1999  Fjelstad
8,048,781 B2   11/2011  How
(Continued)

*Primary Examiner* — Jami Valentine Miller
(74) *Attorney, Agent, or Firm* — Robert D. Atkins; Patent Law Group: Atkins and Associates, P.C.

(57) ABSTRACT

A semiconductor device has a carrier with an adhesive layer formed over the carrier. Alignment marks are provided for picking and placing the electrical component on the carrier or adhesive layer. An electrical component is disposed on the adhesive layer by pressing terminals of the electrical component into the adhesive layer. The electrical component can be a semiconductor die, discrete component, electronic module, and semiconductor package. A leadframe is disposed over the adhesive layer. A shielding layer is formed over the electrical component. An encapsulant is deposited over the electrical component. The carrier and adhesive layer are removed so that the terminals of the electrical component extend out from the encapsulant for electrical interconnect. A substrate includes a plurality of conductive traces. The semiconductor device is disposed on the substrate with the terminals of the electrical component in contact with the conductive traces.

25 Claims, 8 Drawing Sheets

(51) Int. Cl.
*H01L 21/48* (2006.01)
*H01L 23/31* (2006.01)
*H01L 23/498* (2006.01)
*H01L 23/552* (2006.01)

(52) U.S. Cl.
CPC ............ *H01L 2224/95136* (2013.01); *H01L 2924/19105* (2013.01); *H01L 2924/3025* (2013.01)

(56) References Cited

U.S. PATENT DOCUMENTS

| | | | |
|---|---|---|---|
| 9,214,610 B2 | 12/2015 | Tseng et al. | |
| 2010/0124802 A1* | 5/2010 | Chiang | H01L 21/4832 |
| | | | 438/124 |
| 2010/0244233 A1* | 9/2010 | Kim | H01L 21/561 |
| | | | 257/693 |
| 2013/0341784 A1* | 12/2013 | Lin | H01L 23/3121 |
| | | | 257/737 |
| 2015/0214129 A1 | 7/2015 | Kawakita et al. | |
| 2017/0148744 A1* | 5/2017 | Carson | H01L 23/552 |

* cited by examiner

US 10,418,341 B2

SEMICONDUCTOR DEVICE AND METHOD OF FORMING SIP WITH ELECTRICAL COMPONENT TERMINALS EXTENDING OUT FROM ENCAPSULANT

CLAIM TO DOMESTIC PRIORITY

The present application claims the benefit of U.S. Provisional Application No. 62/382,005, filed Aug. 31, 2016, which application is incorporated herein by reference.

FIELD OF THE INVENTION

The present invention relates in general to semiconductor devices and, more particularly, to a semiconductor device and method of forming an SIP with terminals of electrical components extending out from an encapsulant.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Multiple semiconductor die and discrete electrical components can be integrated into a system-in-package (SIP) module for higher density in a small space and extended electrical functionality. The semiconductor die and discrete components are mounted to a module substrate for structural support and electrical interconnect. An encapsulant is deposited over the semiconductor die, discrete components, and module substrate. The SIP module substrate is physically mounted and electrically connected to a board in the next level of integration. The semiconductor die and discrete components make electrical interconnect through the underlying module substrate to the board.

As the underlying module substrate becomes thinner, a carrier is often required to properly handle the module substrate and avoid damage to any component during the manufacturing process. Mounting the semiconductor die and discrete components to the module substrate involves solder paste printing, components attach, reflow, and other complex and costly steps. The module substrate and associated processing accounts for a significant portion of total package cost. An SIP design without a module substrate would be less costly and easier to manufacture.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
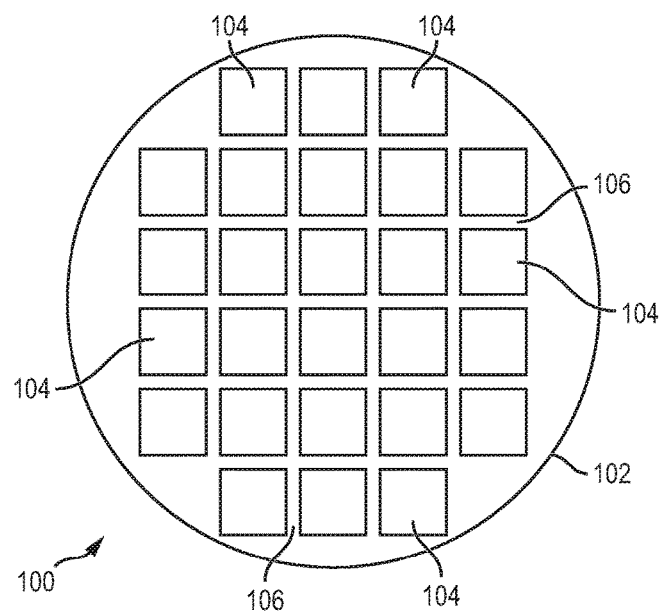
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
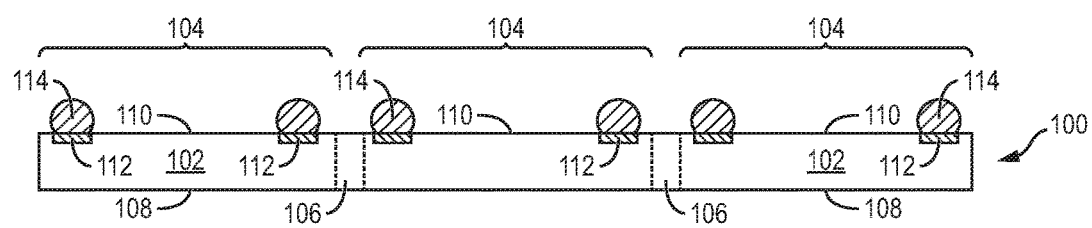

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
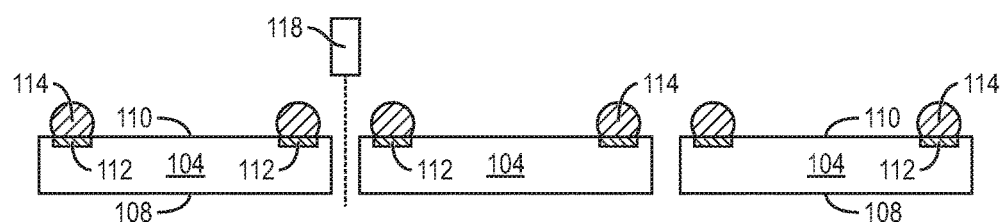

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
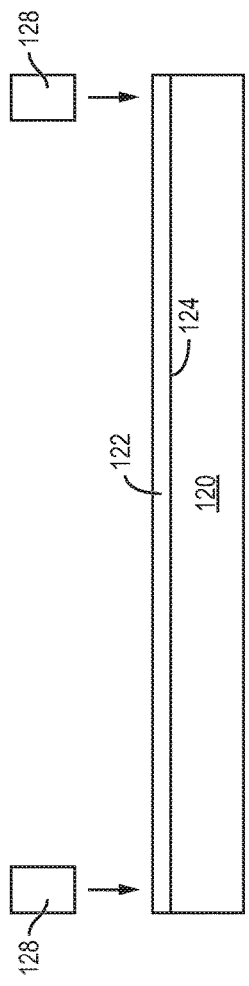
FIGS. 2a-2i illustrate a process of forming an SIP with terminals of electrical components extending out from an encapsulant.
Figure 2B:
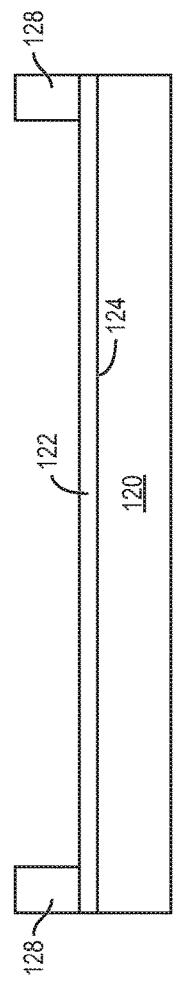

FIGS. 2a-2i illustrate a process of forming an SIP with terminals of electrical components extending out from an encapsulant. FIG. 2a shows a cross-sectional view of temporary substrate or carrier 120 containing sacrificial base material, such as plastic, polymer, beryllium oxide, glass, or other suitable low-cost, rigid material for structural support. In one embodiment, carrier 120 is made with one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. An adhesive layer 122 is formed over surface 124 of carrier 120. Adhesive layer 122 can be a silicon adhesive, acrylic adhesive, or polyimide base film. Leadframe 128 is positioned over adhesive layer 122 on carrier 120. FIG. 2b shows leadframe 128 attached to carrier 120 with adhesive layer 122.

Figure 2C:
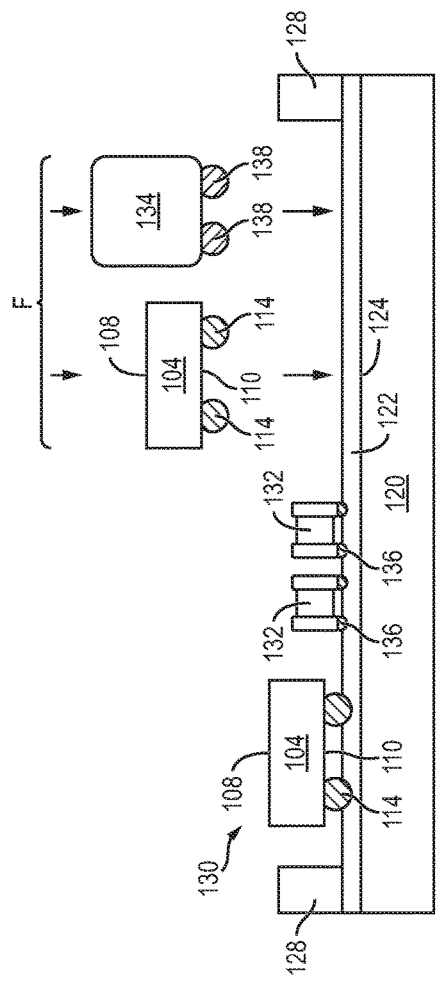
Figure 2D:
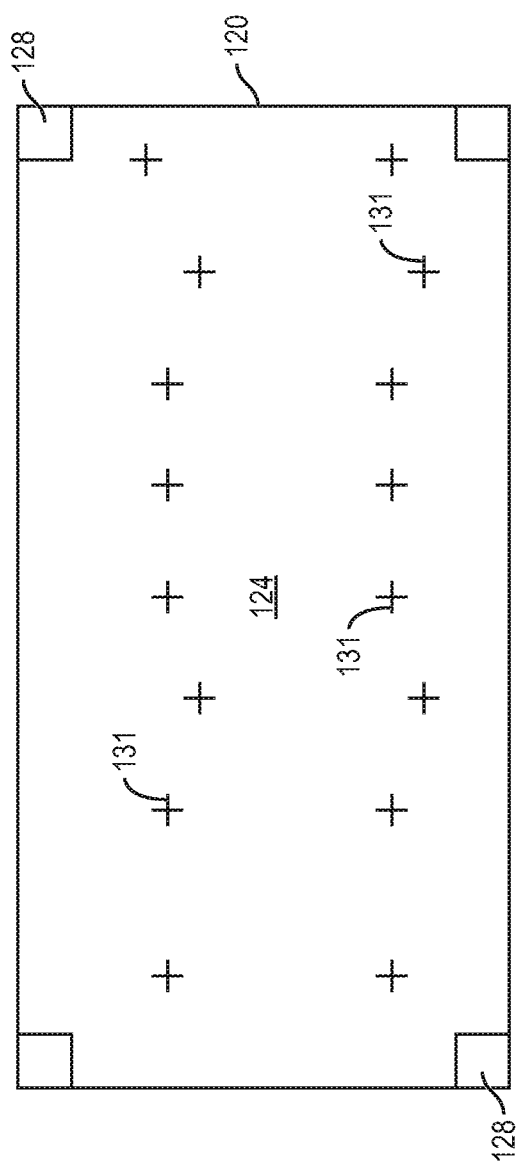

In FIG. 2c, electrical components 130 are positioned over adhesive layer 122 on carrier 120 using a pick and place operation with alignment marks and then attached to the carrier with the adhesive layer. In particular, electrical components 130 are aligned to specific positions on carrier 120 with unique marks 131, such as fiducial markers, as shown in FIG. 2d. Alignment marks 131 are assigned along unit and frame outline as part of the guide frame design.

Figure 2E:
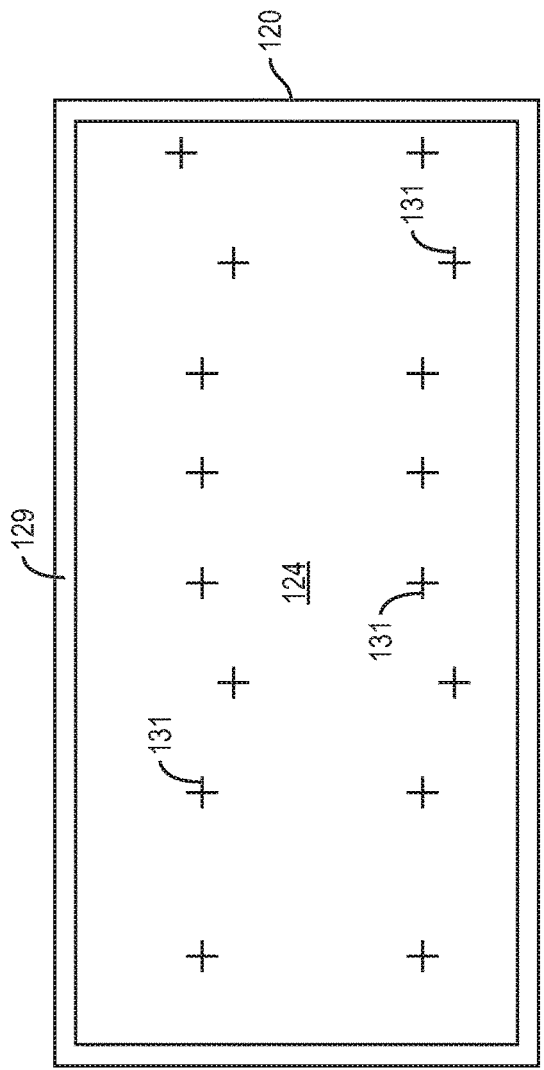

FIG. 2e shows an alternate embodiment with leadframe 129 implemented as a ring disposed around carrier 120. Leadframe 129 can be made with Cu.

Returning to FIG. 2d, each electrical component 130 is pressed into adhesive layer 122 with force F to at least partially embed the electrical interconnects of electrical components 130 into adhesive layer 122. When carrier 120 and adhesive layer 122 are later removed, the electrical interconnects of components 130 will extend out from the encapsulant. Electrical components 130 include semiconductor die 104, as singulated from semiconductor substrate 100 in FIGS. 1a-1c, with active surface 110 and bumps 114 oriented toward adhesive layer 122. Electrical components 130 further include discrete electronic components 132 and 134, such as an inductor, capacitor, resistor, diode, or power transistor, with electrical interconnect terminals 136 of discrete electronic component 132 and electrical interconnect terminals 138 of discrete electronic component 134 oriented toward adhesive layer 122. Other semiconductor or electrical components 130 can include an electronic module and semiconductor package.

Figure 2F:
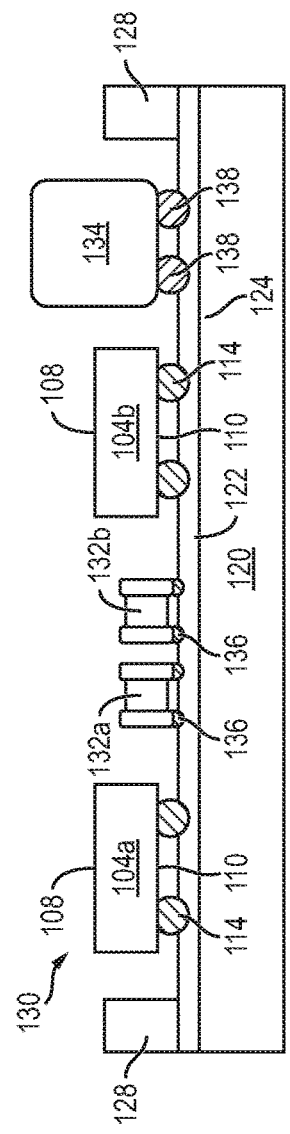

FIG. 2f shows electrical components 130 attached to adhesive layer 122 on carrier 120 with bumps 114 and electrical interconnect terminals 136 and 138 extending into the adhesive layer. In one embodiment, semiconductor die 104a is mounted to adhesive layer 122 with bumps 114 at least partially embedded into the adhesive layer. Discrete electronic component 132a is mounted to adhesive layer 122 with electrical interconnect terminals 136 at least partially embedded into the adhesive layer. Discrete electronic component 132b is mounted to adhesive layer 122 with electrical interconnect terminals 136 at least partially embedded into the adhesive layer. Semiconductor die 104b is mounted to adhesive layer 122 with bumps 114 at least partially embedded into the adhesive layer. Discrete electronic component 134 is mounted to adhesive layer 122 with electrical interconnect terminals 138 at least partially embedded into the adhesive layer.

Figure 2G:
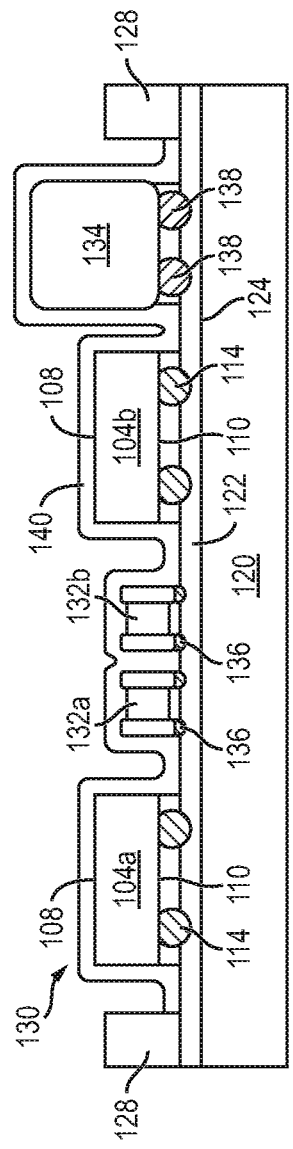

Semiconductor die 104 and discrete electronic components 132 and 134 may contain IPDs that are susceptible to EMI, RFI, harmonic distortion, and inter-device interference. For example, the IPDs contained within semiconductor die 104 and discrete electronic components 132 and 134 provide the electrical characteristics needed for high frequency applications, such as resonators, high-pass filters, low-pass filters, band-pass filters, symmetric Hi-Q resonant transformers, and tuning capacitors. To reduce the effects of EMI and RFI, shielding layer 140 can be conformally applied over electrical components 130, as shown in FIG. 2g. Shielding layer 140 can be one or more layers of Al, Cu, Sn, Ni, Au, Ag, or other suitable conductive material. Alternatively, shielding layer 140 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Shielding layer 140 is electrically connected to an external ground point to reduce the influence of EMI and RFI on electrical components 130.

Figure 2H:
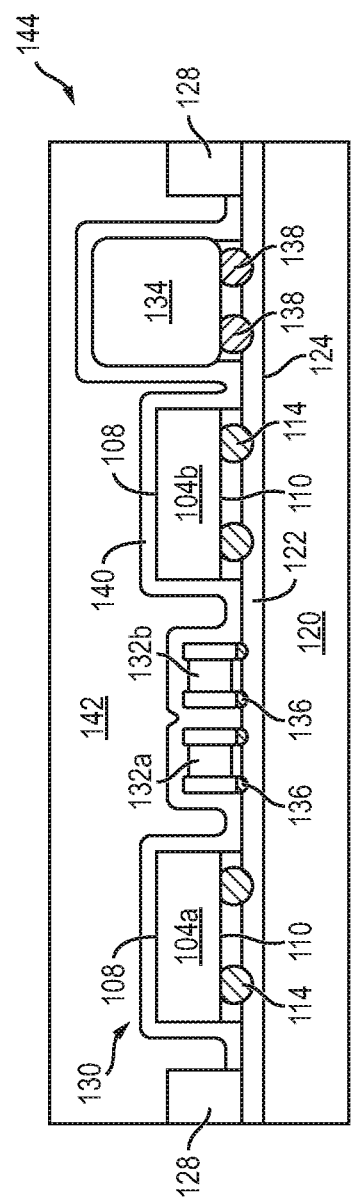

In FIG. 2h, an encapsulant or molding compound 142 is deposited over electrical components 130, leadframe 128, and adhesive layer 122 over carrier 120 to form SIP 144 using a compressive molding, transfer molding, liquid encapsulant molding, vacuum lamination, spin coating, or other suitable applicator. In one embodiment, encapsulant 142 is deposited by compression molding to apply vertical force with reduced force along horizontal axis. Compression molding has a low risk for component movement during molding. Encapsulant 142 can be polymer composite material, such as epoxy resin with filler, epoxy acrylate with filler, or polymer with proper filler. Encapsulant 142 is non-conductive, provides structural support, and environmentally protects the semiconductor device from external elements and contaminants. In particular, electrical components 130 remain stable and do not shift or otherwise move during encapsulation because bumps 114 and electrical interconnect terminals 136 and 138 are at least partially embedded into adhesive layer 122. Bumps 114 and electrical interconnect terminals 136 and 138 extending at least partially into adhesive layer 122 provide a stable anchor point to keep electrical components 130 in place while depositing encapsulant 142.

Figure 2I:
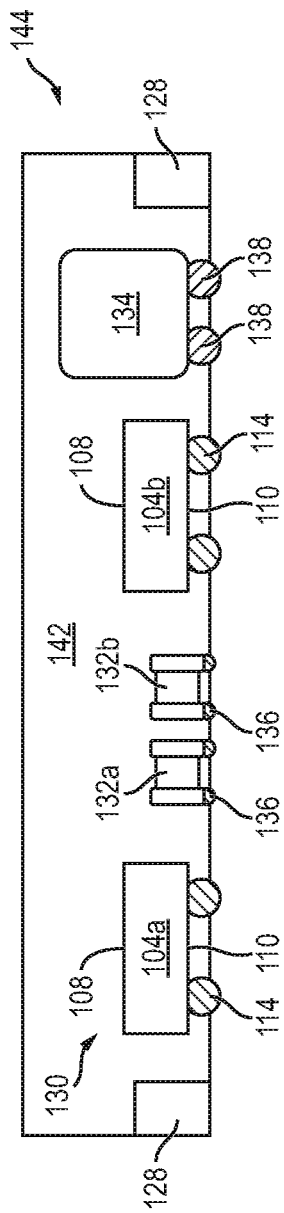

In FIG. 2i, temporary carrier 120 and adhesive layer 122 are removed by chemical etching, mechanical peel-off, CMP, mechanical grinding, thermal bake, ultra-violet (UV) light, laser scanning, or wet stripping leaving SIP 144. Removing carrier 120 and adhesive layer 122 leaves bumps 114 and electrical interconnect terminals 136 and 138 extending out from encapsulant 142. Bumps 114 and electrical interconnect terminals 136 and 138 provide a ball grid array like external package interconnect. The process of forming SIP 144 in FIGS. 2a-2i is simple, low cost, and accomplished without a conventional substrate, as described in the background.

Figure 3:
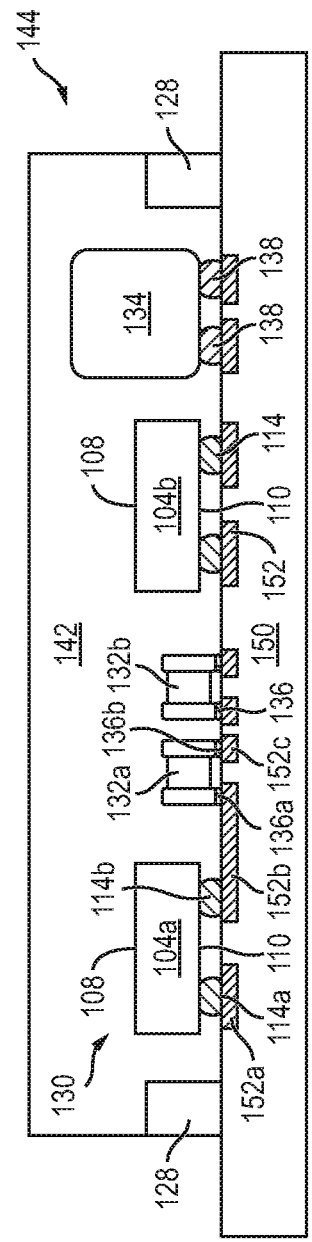
FIG. 3 illustrates the SIP mounted to a PCB for electrical interconnect.

FIG. 3 shows SIP 144 mounted to PCB or substrate 150 with electrical components 130 within the semiconductor package electrically interconnected by conductive traces 152 formed on PCB 150. In particular, bumps 114 and electrical interconnect terminals 136 and 138 of SIP 144, as extending out from encapsulant 142 by the process described in FIGS. 2a-2i, make contact with conductive traces 152 for internal and external electrical interconnect with respect to the package. For example, bump 114a makes contact with conductive trace 152a for external interconnect with respect to SIP 144 through PCB 150. Bump 114b makes contact with conductive trace 152b for interconnect with terminal 136a for interconnect between different electrical components 130, i.e., between semiconductor die 104a and discrete electronic components 132a. Terminal 136b makes contact with conductive trace 152c for external interconnect with respect to SIP 144 through PCB 150.

Figure 4:
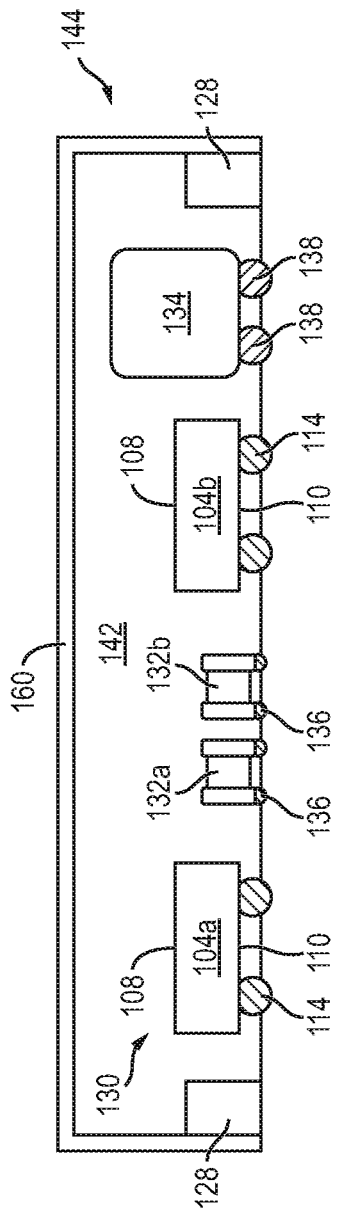
FIG. 4 illustrates a shielding layer formed over the SIP.

FIG. 4 illustrates a shielding layer 160 formed over encapsulant 142 and leadframe 128 of SIP 144. Shielding layer 160 can be one or more layers of Al, Cu, Sn, Ni, Au, Ag, or other suitable conductive material. Alternatively, shielding layer 160 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Shielding layer 160 is electrically connected to an external ground point on PCB 150, e.g. through leadframe 128, to reduce the influence of EMI and RFI on electrical components 130.

Figure 5:
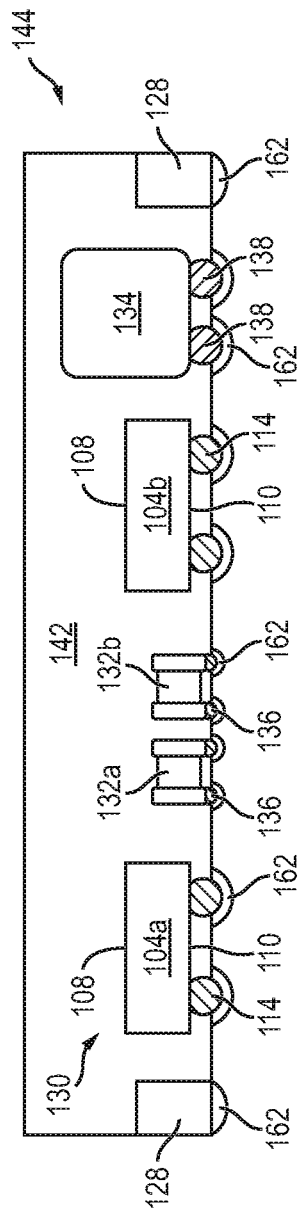
FIG. 5 illustrates an interconnect bonding material formed over the leadframe and terminals of the electrical components extending out from the encapsulant.

FIG. 5 illustrates an interconnect bonding material 162 formed over bumps 114 and electrical interconnect terminals 136 and 138 of SIP 144 to enhance adhesion and provide reliable interconnection to PCB 150. The interconnect bonding material 162 can be solder plating, solder ball attach, or solder paste printing. The interconnect bonding material 162 can also be applied to leadframe 128, e.g. in combination with shielding layer 160 of FIG. 4 to connect the shielding layer to PCB 150.

Figure 6:
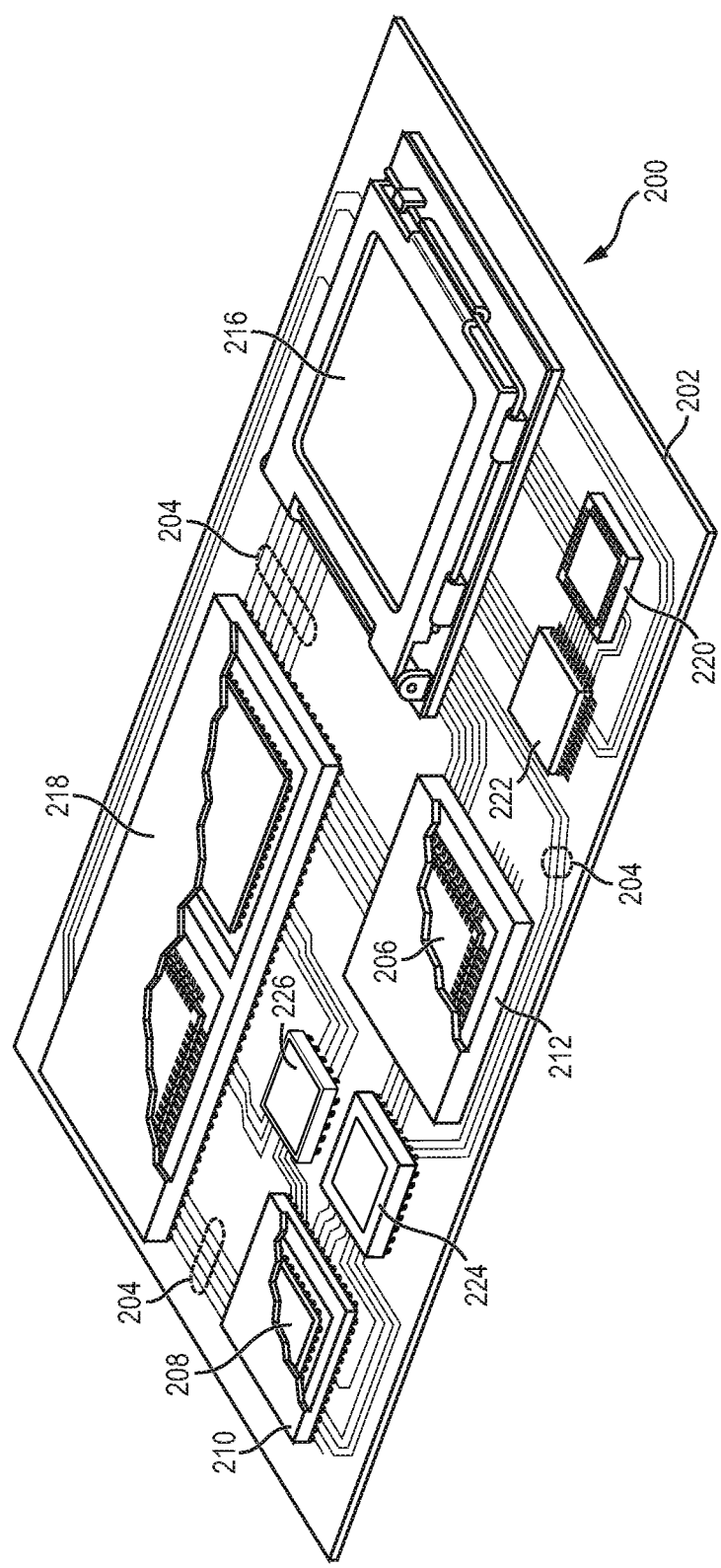
FIG. 6 illustrates the PCB with different types of packages mounted to a surface of the PCB.

FIG. 6 illustrates electronic component 200 having a chip carrier substrate or printed circuit board (PCB) 202 with a plurality of semiconductor packages mounted on a surface of PCB 202, including SIP 144. Electronic device 200 can have one type of semiconductor package, or multiple types of semiconductor packages, depending on the application.

Electronic device 200 can be a stand-alone system that uses the semiconductor packages to perform one or more electrical functions. Alternatively, electronic device 200 can be a subcomponent of a larger system. For example, electronic device 200 can be part of a tablet, cellular phone, digital camera, communication system, or other electronic device. Alternatively, electronic device 200 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 6, PCB 202 provides a general substrate for structural support and electrical interconnect of the semiconductor packages mounted on the PCB. Conductive signal traces 204 are formed over a surface or within layers of PCB 202 using evaporation, electrolytic plating, electroless plating, screen printing, or other suitable metal deposition process. Signal traces 204 provide for electrical communication between each of the semiconductor packages, mounted components, and other external system components. Traces 204 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 206 and flipchip 208, are shown on PCB 202. Additionally, several types of second level packaging, including ball grid array (BGA) 210, bump chip carrier (BCC) 212, land grid array (LGA) 216, multi-chip module (MCM) 218, quad flat non-leaded package (QFN) 220, quad flat package 222, embedded wafer level ball grid array (eWLB) 224, and wafer level chip scale package (WLCSP) 226 are shown mounted on PCB 202. In one embodiment, eWLB 224 is a fan-out wafer level package (Fo-WLP) and WLCSP 226 is a fan-in wafer level package (Fi-WLP). Depending upon the system requirements, any combination of semiconductor packages, configured with any combination of first and second level packaging styles, as well as other electronic components, can be connected to PCB 202. In some embodiments, electronic device 200 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   forming an adhesive layer over the carrier;
   disposing a leadframe over the carrier or adhesive layer;
   disposing an electrical component on the adhesive layer within the leadframe by pressing terminals of the electrical component into the adhesive layer;
   depositing an encapsulant over the electrical component and leadframe; and
   removing the carrier to leave the terminals of the electrical component extending out from the encapsulant for electrical interconnect.

2. The method of claim 1, wherein a contact terminal of the leadframe is exposed from the encapsulant.

3. The method of claim 1, wherein the electrical component is selected from the group consisting of a semiconductor die, discrete component, electronic module, and semiconductor package.

4. The method of claim 1, further including providing alignment marks for positioning the electrical component on the carrier or adhesive layer.

5. The method of claim 1, further including forming a shielding layer over the electrical component.

6. The method of claim 1, further including:
   providing a substrate including a plurality of conductive traces; and
   disposing the semiconductor device on the substrate with the terminals of the electrical component in contact with the conductive traces.

7. A method of making a semiconductor device, comprising:
   providing a carrier;
   disposing a leadframe over the carrier;
   disposing an electrical component on the carrier within the leadframe;
   depositing an encapsulant over the electrical component and leadframe; and
   removing the carrier to leave terminals of the electrical component extending out from the encapsulant for electrical interconnect.

8. The method of claim 7, further including forming an adhesive layer over the carrier.

9. The method of claim 8, further including providing alignment marks for positioning the electrical component on the carrier or adhesive layer.

10. The method of claim 8, further including pressing the terminals of the electrical component into the adhesive layer.

11. The method of claim 7, wherein a contact terminal of the leadframe is exposed from the encapsulant.

12. The method of claim 7, wherein the electrical component is selected from the group consisting of a semiconductor die, discrete component, electronic module, and semiconductor package.

13. The method of claim 7, further including forming a shielding layer over the electrical component.

14. A method of making a semiconductor device, comprising:
   providing a leadframe;
   disposing an electrical component within the leadframe; and
   depositing an encapsulant over the electrical component and leadframe while leaving terminals of the electrical components extending out from the encapsulant.

15. The method of claim 14, further including:
   providing a carrier;
   forming an adhesive layer over the carrier; and
   removing the carrier to leave the terminals of the electrical component extending out from the encapsulant for electrical interconnect.

16. The method of claim 15, further including providing alignment marks for the electrical component on the carrier or adhesive layer.

17. The method of claim 15, further including pressing the terminals of the electrical component into the adhesive layer.

18. The method of claim 15, wherein a contact terminal of the leadframe is exposed from the encapsulant.

19. The method of claim 14, wherein the electrical component is selected from the group consisting of a semiconductor die, discrete component, electronic module, and semiconductor package.

20. The method of claim 14, further including forming a shielding layer over the electrical component.

21. A method of making a semiconductor device, comprising:
   providing a carrier;
   forming an adhesive layer over the carrier;
   disposing a leadframe over the carrier or adhesive layer;
   disposing an electrical component on the adhesive layer within the leadframe with terminals of the electrical component extending into the adhesive layer;
   depositing an encapsulant over the electrical component and leadframe; and
   removing the carrier.

22. The method of claim 21, further including disposing alignment marks on the carrier or adhesive layer.

23. The method of claim 21, wherein a contact terminal of the leadframe is exposed from the encapsulant.

24. The method of claim 21, wherein the electrical component is selected from the group consisting of a semiconductor die, discrete component, electronic module, and semiconductor package.

25. The method of claim 21, further including forming a shielding layer over the electrical component.

* * * * *